United States Patent
Ogura et al.

(10) Patent No.: US 8,253,505 B2
(45) Date of Patent: Aug. 28, 2012

(54) PACKAGE AND VIBRATING DEVICE USING THE SAME

(75) Inventors: Seiichiro Ogura, Minowa-machi (JP); Takayuki Kikuchi, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 29 days.

(21) Appl. No.: 12/954,774

(22) Filed: Nov. 26, 2010

(65) Prior Publication Data

US 2011/0133847 A1 Jun. 9, 2011

(30) Foreign Application Priority Data

Dec. 4, 2009 (JP) ................................ 2009-276141
Sep. 29, 2010 (JP) ................................ 2010-218334

(51) Int. Cl.
*H03B 5/32* (2006.01)
*H03B 1/00* (2006.01)
*H01L 41/053* (2006.01)

(52) U.S. Cl. ........ 331/156; 331/68; 331/108 C; 310/348

(58) Field of Classification Search ............... 331/68, 331/108 C, 108 D, 116 FE, 116 M, 116 R, 331/154, 156, 158; 310/311, 348, 349
See application file for complete search history.

(56) References Cited

U.S. PATENT DOCUMENTS

| 6,204,454 | B1 * | 3/2001 | Gotoh et al. | 174/255 |
| 6,274,968 | B1 * | 8/2001 | Wajima et al. | 310/348 |
| 7,157,836 | B2 * | 1/2007 | Kinoshita | 310/348 |
| 7,675,224 | B2 * | 3/2010 | Tanaya | 310/370 |
| 7,876,029 | B2 * | 1/2011 | Matsugi | 310/348 |
| 8,069,549 | B2 * | 12/2011 | Nagano et al. | 29/594 |

FOREIGN PATENT DOCUMENTS

JP A-2005-241380 9/2005

* cited by examiner

*Primary Examiner* — Levi Gannon
(74) *Attorney, Agent, or Firm* — Oliff & Berridge, PLC (57) ABSTRACT

A vibrating device includes: a package having an internal space; and a vibrating reed housed in the internal space of the package, wherein the package has a porous portion formed of a communication hole communicating between the internal space and the outside and a porous body buried in the communication hole, and a metal film closing the internal space is arranged on the outside side of the porous portion.

10 Claims, 4 Drawing Sheets

PACKAGE AND VIBRATING DEVICE USING THE SAME

The entire disclosure of Japanese Patent Application No. 2009-276141, filed on Dec. 4, 2009 and Japanese Patent Application No. 2010-218334, filed on Sep. 29, 2010 are expressly incorporated by reference herein.

BACKGROUND

1. Technical Field

The present invention relates to a package and a vibrating device having a vibrating reed housed in the package.

2. Related Art

As a clock source or the like of an electronic circuit of various electronic apparatuses such as information and telecommunications equipment, office automation equipment including computers, or consumer equipment, a vibrating device having a vibrating reed bonded and tightly sealed in a package has been widely used. Especially in recent years, with a growing need for a smaller and thinner electronic apparatus, a further smaller and thinner vibrating device is required. In addition, many surface mount package type vibrating devices suitable for mounting on a circuit board of an electronic apparatus have been adopted (refer to JP-A-2005-241380, for example).

A piezoelectric device (hereinafter referred to as vibrating device) disclosed in JP-A-2005-241380 has a package (hereinafter referred to as package base) having a concave portion formed by stacking, on flat plate-like base substrates (first and second substrates) obtained by shaping base materials such as green sheets for example, a frame-like substrate (third substrate), and then firing them, and a piezoelectric vibrating reed (hereinafter referred to as vibrating reed) housed in the concave portion of the package base. The vibrating reed is positioned on mount electrodes (electrode portions) disposed in the concave portion of the package base and bonded thereto with a bonding member such as a conductive adhesive, thereby being electrically connected thereto.

A lid (lid member) is bonded to an open upper end of the package base to form the package, and the vibrating reed is housed in an internal space (cavity) of the package formed by closing the concave portion with the lid.

In the bottom of the package, a through hole communicating between the internal space and the outside is formed. The through hole includes a large hole on the outside side and a small hole on the internal space side formed in a concentric fashion in communication with each other. Because of the difference in size of the opening shape, a step portion is formed at an intermediate part of the through hole.

A sealing (hole sealing) process for the vibrating device is carried out by placing the package inside a vacuum chamber or the like, for example. Specifically, outgas remained inside the package is first discharged to the outside through the through hole by drawing a vacuum.

Next, by a method of, for example, irradiating a sealing member formed of a spherical metal arranged on the step portion of the through hole with a laser beam, the sealing member is melted to close the through hole, so that the vibrating reed bonded in the package is tightly sealed in a favorable state where a noxious outgas is removed from the internal space.

However, in the vibrating device disclosed in JP-A-2005-241380, since the through hole is disposed in the package for removing the gas and sealing the hole, the mechanical strength is reduced. Therefore, due to pressure applied when depressurizing the internal space in the sealing process for the vibrating device, or impacts such as dropping, there is a problem that, for example, a crack starting from the through hole may occur in the package. Especially in view of achieving a reduction in size of the package, the mechanical strength may be remarkably reduced.

SUMMARY

An advantage of some aspects of the invention is to solve at least a part of the problems described above, and the invention can be realized as the following modes or application examples.

FIRST APPLICATION EXAMPLE

A vibrating device according to a first application example includes: a package having an internal space; and a vibrating reed housed in the internal space of the package, wherein the package has a porous portion formed of a communication hole communicating between the internal space and the outside and a porous body buried in the communication hole, and a metal film closing the internal space is arranged on the outside side of the porous portion.

According to the vibrating device of the application example, after outgas is released from the porous portion in which the porous body is buried, the porous portion is closed with the metal film, whereby the vibrating reed can be tightly sealed in the package. Thus, compared to a related-art package having a structure in which sealing is carried out by depressurizing an internal space while releasing outgas via a through hole (sealing hole) communicating between the internal space and the outside, and then closing the through hole with a sealant, the porous portion communicating between the internal space and the outside has a high mechanical strength. Therefore, it is possible to avoid trouble such as the occurrence of a crack in the package.

SECOND APPLICATION EXAMPLE

The vibrating device according to the application example may be configured such that the package has a base substrate formed by stacking two flat plate-like base materials, the porous portion is formed in the flat plate-like base material on the internal space side of the two flat plate-like base materials, and a communication hole through which the porous portion is visible from the outside is formed in the flat plate-like base material on the outside side.

According to the configuration, the metal film closing the porous portion is formed on a surface on the outside side of the flat plate-like base material on the internal space side, of the base substrate having the two flat plate-like base materials. Therefore, it is possible to avoid trouble such as the occurrence of a flaw in the metal film caused by the contact of the package bottom surface with an external mounting substrate or the like, or a sealing failure caused by peeling of the metal film, as in the case where the metal film is formed on the outside side of the flat plate-like base material on the outside side, that is, on the bottom surface of the package.

THIRD APPLICATION EXAMPLE

The vibrating device according to the application example may be configured such that the porous portion is disposed on a side wall of the package.

According to the configuration, the porous portion is disposed not in the base substrate serving as a mounting surface relative to an external mounting substrate but in the side wall of the package. Therefore, it is possible to avoid trouble such as the occurrence of a flaw caused by the contact of the metal film closing the communication between the outside side of the porous portion and the internal space side with an external mounting substrate or the like, or a sealing failure caused by peeling of the metal film.

Moreover, compared to the case of disposing the porous portion in the bottom surface of the package, the area of the vibrating device as viewed in plan can be reduced.

FOURTH APPLICATION EXAMPLE

The vibrating device according to the application example may be configured such that the metal film is formed by sputtering or vapor deposition.

According to the configuration, it is possible to form the metal film while depressurizing the internal space of the vibrating device and removing outgas in a chamber to close the porous portion, and to tightly seal the package.

FIFTH APPLICATION EXAMPLE

The vibrating device according to the application example may be configured such that a periphery of the porous portion on a surface on the outside side of the package is metalized.

According to the configuration, since the metal film for closing the porous portion is efficiently formed, and the adhesion of the metal film is improved, the package can be tightly sealed reliably.

SIXTH APPLICATION EXAMPLE

A package capable of housing a vibrating reed in an internal space thereof according to a sixth application example includes; a porous portion formed of a communication hole communicating between the internal space and the outside, and a porous body buried in the communication hole.

According to the package having the above configuration, after outgas is released from the porous portion in which the porous body is buried, the porous portion is closed by, for example, forming a metal film, whereby the vibrating reed can be tightly sealed in the internal space. Thus, compared to the related-art package having a structure in which sealing is carried out by closing a through hole (sealing hole) with a sealant, the porous portion communicating between the internal space and the outside has a high mechanical strength. Therefore, it is possible to avoid trouble such as the occurrence of a crack in the package.

SEVENTH APPLICATION EXAMPLE

The package according to the application example may be configured such that the package further includes a base substrate formed by stacking two flat plate-like base materials, wherein the porous portion is formed in the flat plate-like base material on the internal space side, of the two flat plate-like base materials, and a communication hole through which the porous portion is visible from the outside is formed in the flat plate-like base material on the outside side.

According to the configuration, the metal film closing the porous portion is formed on a surface on the outside side of the flat plate-like base material on the internal space side, of the base substrate having the two flat plate-like base materials. Therefore, it is possible to avoid trouble such as the occurrence of a flaw in the metal film caused by the contact of the metal film with an external mounting substrate, or a sealing failure caused by peeling of the metal film, as in the case where the metal film is formed on the outside side of the flat plate-like base material on the outside side, that is, on the bottom surface of the package.

EIGHTH APPLICATION EXAMPLE

The package according to the application example may be configured such that the porous portion is disposed on a side wall.

According to the configuration, the porous portion is disposed not in the base substrate serving as a mounting surface relative to an external substrate but in the side wall of the package. Therefore, it is possible to avoid trouble such as the occurrence of a flaw caused by the contact of the metal film closing the communication between the outside side of the porous portion and the internal space side with an external mounting substrate or the like, or a sealing failure caused by peeling of the metal film.

Moreover, compared to the case of disposing the porous portion in the bottom surface of the package, the area of the package as viewed in plan can be reduced.

NINTH APPLICATION EXAMPLE

The package according to the application example may be configured such that a periphery of the porous portion on a surface on the outside side is metalized.

According to the configuration, since the metal film for closing the porous portion is efficiently formed, and the adhesion of the metal film is improved, it is possible to provide a package which can be tightly sealed reliably.

TENTH APPLICATION EXAMPLE

An electronic apparatus according to a tenth application example includes the vibrating device according to any one of the first to fifth application examples.

According to the configuration, it is possible to provide an electronic apparatus which exhibits the effects described in any one of the first to fifth application examples.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred embodiment of the invention will be described with reference to the drawings.

Figure 1A:
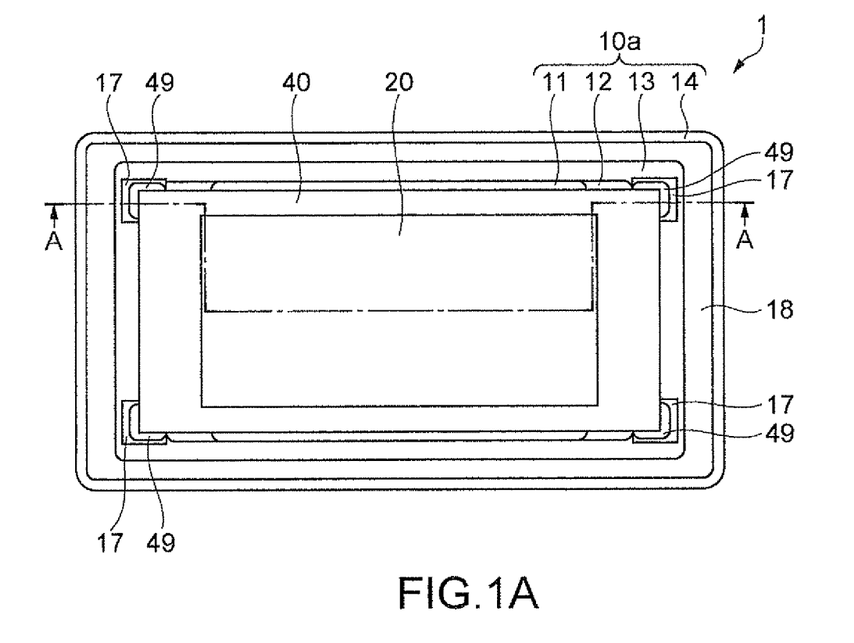
FIG. 1A is a schematic plan view explaining a vibrating gyro as a vibrating device according to an embodiment as viewed from above.
Figure 1B:
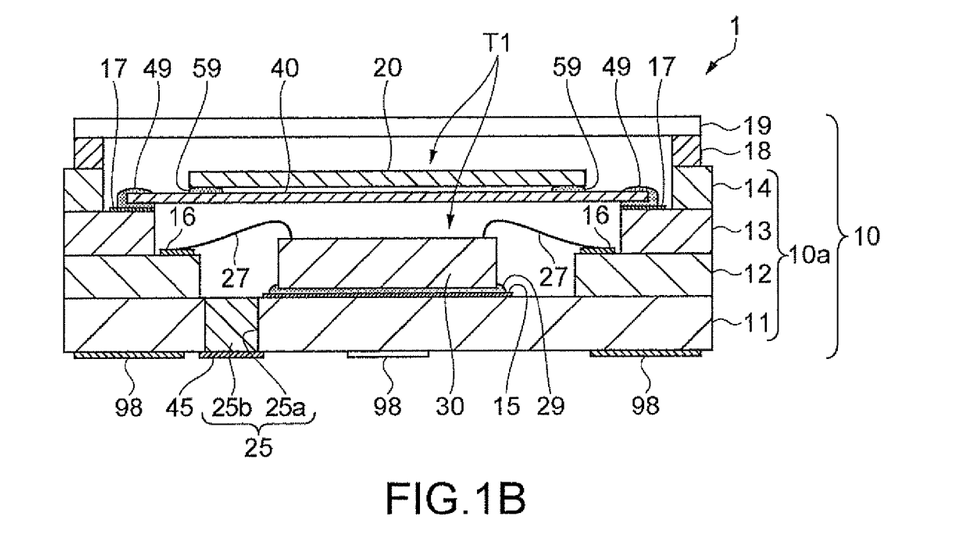
FIG. 1B is a schematic cross-sectional view showing an A-A line section of FIG. 1A.
Figure 2:
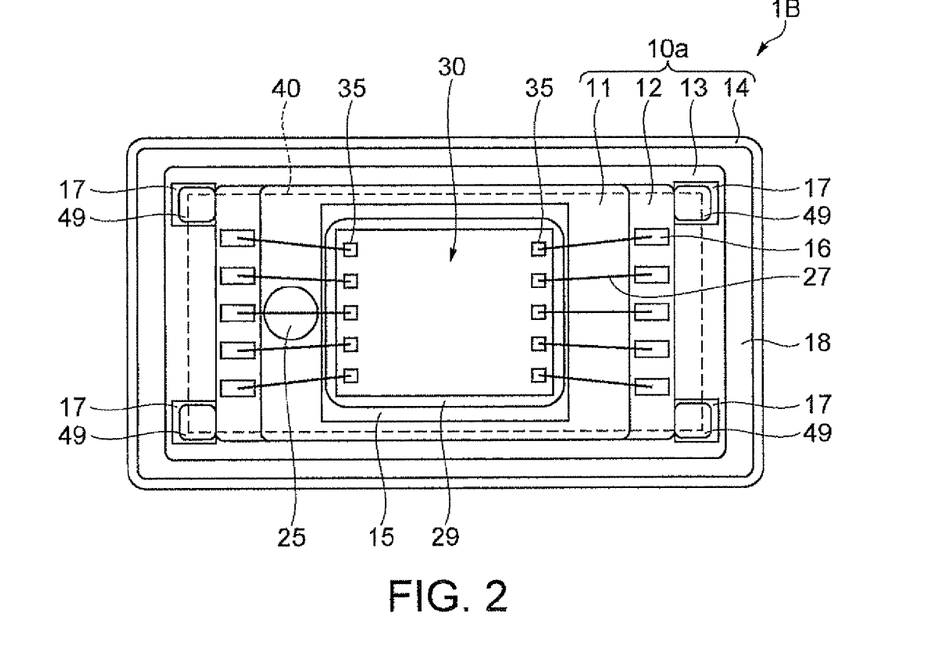
FIG. 2 is a schematic plan view explaining an IC mounting portion according to the vibrating gyro.
Figure 3:
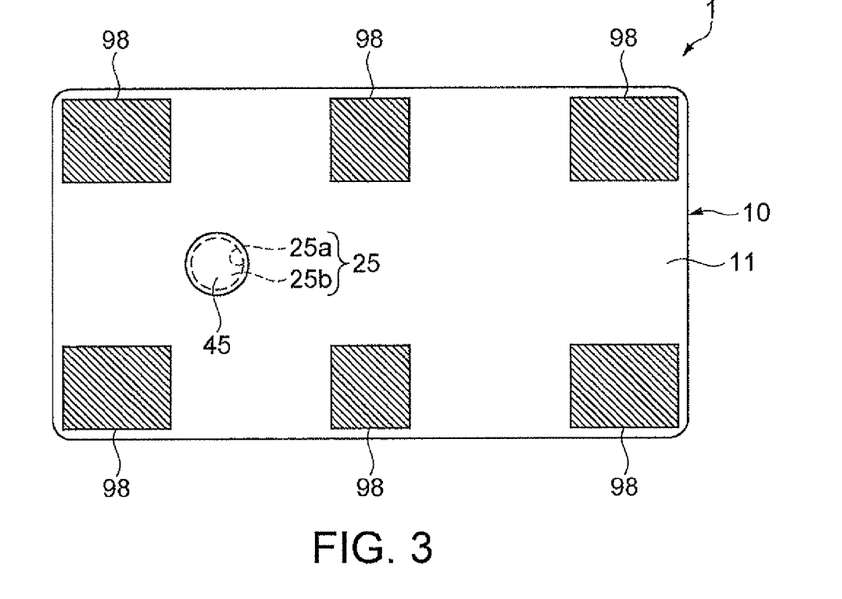
FIG. 3 is a schematic plan view of the vibrating gyro according to the embodiment as viewed from the bottom surface side.

FIGS. 1A and 1B explain a vibrating device according to an embodiment, in which FIG. 1A is a schematic plan view as viewed from above; and FIG. 1B is a schematic cross-sectional view showing an A-A line section of FIG. 1A. FIG. 1A illustrates the vibrating device in a state where a lid 19 disposed at the top of the vibrating device is removed for purposes of explaining the internal structure of a vibrating gyro. FIG. 2 is a schematic plan view explaining an IC mounting portion according to the vibrating gyro of the embodiment. FIG. 3 is a schematic plan view of the vibrating gyro as viewed from the bottom surface side.

In an example described below, the vibrating device is configured as a gyro sensor (hereinafter referred to as vibrating gyro) having a gyro function.

In FIGS. 1A and 1B, the vibrating gyro 1 has a package 10 which includes a package base 10a provided with a concave portion having steps, and the lid 19 covering the package base 10a. An IC chip 30 bonded to a concave bottom portion of the concave portion of the package base 10a and a gyro vibrating reed 20 as a vibrating reed bonded above the IC chip 30 in the package base 10a via a relay substrate 40 are tightly sealed by bonding the lid 19 above the package base 10a.

Gyro Vibrating Reed

The gyro vibrating reed 20 has, for example, an excitation vibrating portion and a detection vibrating portion integrally formed by processing a piezoelectric material such as quartz, an exciting electrode for exciting the excitation vibrating portion, a detection electrode for detecting charge generated from the detection vibrating portion (none of them are shown), and the like. For example, a tuning-fork type quartz vibrating reed or the like which presents a tuning-fork outer shape can be used. Such an outer shape of the gyro vibrating reed 20 can be precisely formed by, for example, wet etching with a hydrofluoric acid solution or the like, or dry etching a piezoelectric substrate material such as a quartz wafer.

Examples of the material of the gyro vibrating reed 20 include, for example, lithium tantalate and lithium niobate in piezoelectric materials other than quartz, and include a semiconductor such as silicon other than piezoelectric materials.

The driving method for vending vibration may be an electrostatic drive due to the Coulomb force in addition to a method using the piezoelectric effect of a piezoelectric body.

The gyro vibrating reed 20 vibrates at the detection vibrating portion when an angular velocity is applied, and charge is generated in the detection electrode. The charge is detected by the detection electrode and is output as a detection signal to the outside of the vibrating gyro 1 via the wiring pattern of the relay substrate 40, connection terminals, and electrodes. The magnitude of the rotational angular velocity applied to the gyro vibrating reed 20 can be recognized by a not-shown processor.

Package

Next, the package 10 used for the vibrating gyro 1 of the embodiment will be described in detail based on the drawings.

In FIGS. 1A to 3, the package 10 includes the package base 10a and the lid 19. The package 10 also has an internal space T2 formed by covering (occluding or closing) the concave portion of the package base 10a with the lid 19.

The package base 10a is configured by stacking, on a first-layer substrate 11 as a base substrate formed of one flat plate-like base material, a second-layer substrate 12, a third-layer substrate 13, and a fourth-layer substrate 14 in this order as frame-like substrates each having an opening different in size, whereby the concave portion having the opening on the upper surface side and provided with the steps inside thereof is formed. The gyro vibrating reed 20 and the IC chip 30 can be housed in the concave portion. As the material of the package base 10a, ceramics, glass, or the like can be used, for example.

As shown in FIGS. 1B and 2, a die pad 15 on which the IC chip 30 is arranged is disposed on the first-layer substrate 11 serving as the concave bottom portion of the concave portion of the package base 10a. A plurality of external mounting terminals 98 serving for bonding with an external substrate are disposed on the bottom surface (on the surface opposite to the surface where the die pad 15 is disposed) of the first-layer substrate 11 as the outer bottom surface of the package base 10a.

Further, the first-layer substrate 11 forming the bottom of the package base 10a has a porous portion 25 which is formed of a communication hole 25a disposed so as to communicate between the outside of the package and the internal space T1, and a porous body 25b buried in the communication hole 25a.

The porous body 25b is a member having numerous micrometer-sized pores (air holes) obtained by, for example, applying special processing to ceramics or the like. With this configuration, at a stage where the package 10 has been manufactured, the internal space T1 of the package 10 is in communication with the outside through the porous body 25b having the numerous pores. As the material used for the porous body 25b, silicon carbide, cordierite, alumina, zirconia, or the like can be used, for example.

In the concave portion of the package base 10a, a plurality of IC connection terminals 16 serving for electrical connection to the IC chip 30 are disposed on the step formed by the second-layer substrate 12. Further in the concave portion of the package base 10a, a plurality of relay substrate connection terminals 17 to which the relay substrate 40 having the gyro vibrating reed 20 mounted thereon is bonded are disposed on the step formed by the third-layer substrate 13.

In this manner, the various kinds of terminals disposed in the package base 10a are connected to each other in a correspondence manner through not-shown routed wiring or interlayer wiring such as through holes.

The IC chip 30 includes a drive circuit for driving and vibrating the gyro vibrating reed 20 and a detection circuit which detects detecting vibration generated in the gyro vibrating reed 20 when an angular velocity is applied.

Specifically, the drive circuit of the IC chip supplies a drive signal to an exciting electrode formed in a drive vibrating reed of the gyro vibrating reed 20. The detection circuit of the IC chip 30 amplifies a detection signal generated in the detection electrode formed in the detection vibrating portion of the gyro vibrating reed 20 to generate an amplified signal, and detects a physical quantity, for example, an angular velocity based on the amplified signal.

In the IC mounting portion 1B of the vibrating gyro 1 shown in FIG. 2, the IC chip 30 is adhered and fixed on the die pad 15 disposed in the concave bottom portion of the concave portion of the package base 10a with, for example, a brazing filler metal 29.

The IC chip 30 and the package base 10a are electrically connected using a wire bonding method in the embodiment. That is, a plurality of electrode pads 35 disposed in the IC chip 30 and the corresponding IC connection terminals 16 of the package base 10a are connected with bonding wires 27.

In the concave portion of the package base 10a, the relay substrate 40 to which the gyro vibrating reed 20 is bonded is arranged above the IC chip 30.

Specifically, external connection terminals (not shown) of the gyro vibrating reed 20 are positioned with not-shown vibrating reed connection terminals disposed on one of main surfaces of the relay substrate 40, and they are bonded and electrically connected to each other with bonding members 59 having conductivity, such as a silver paste for example (refer to FIG. 1B).

Not-shown connection terminals are disposed at least at both ends on the other main surface side of the relay substrate 40, the connection terminals are positioned with the relay substrate connection terminals disposed on the step formed by the third-layer substrate 13 in the concave portion of the package base 10a, and they are bonded and electrically connected to each other with conductive bonding members 49 such as a silver paste for example.

In the embodiment, the relay substrate 40 is fixed at two sides (both ends) facing each other in its longitudinal direction on the step on which the relay substrate connection terminals 17 are disposed in the package base 10a. With this configuration, the relay substrate 40 having the gyro vibrating reed 20 mounted thereon is installed with a gap between the relay substrate and the concave bottom portion of the concave portion of the package base 10a and with the IC chip 30 arranged therebetween.

As shown in FIG. 1B, the lid 19 as a lid member is arranged above the package base 10a having the IC chip 30 and the gyro vibrating reed 20 bonded in the concave portion, thereby occluding (closing) the opening of the package base 10a. As the material of the lid 19, a metal such as 42 alloy (an iron alloy containing 42% nickel) or Kovar (an alloy of iron, nickel, and cobalt), ceramics, glass, or the like can be used, for example.

For example, the lid 19 formed of a metal is bonded to the package base 10a by seam welding via a seal ring 18 formed by punching Kovar alloy or the like into an annular rectangular shape.

The internal space T1 formed of the concave portion of the package base 10a and the lid 19 serves as a space in which the gyro vibrating reed 20 operates. The space can be hermetically-sealed to be a reduced-pressure space or an inert gas atmosphere.

For example, when the internal space T1 is hermetically-sealed to be a reduced-pressure space, the process is carried out by placing the package 10 to which the lid 19 has been bonded inside a vacuum chamber or the like.

Specifically, after placing the package 10 in a vacuum chamber, the pressure is reduced to a predetermined degree of vacuum, whereby the gas in the internal space T1 of the package 10 generated by heating in the previous step is discharged from the porous body 25b of the porous portion 25 to the outside. That is, a noxious gas (outgas) generated in the process of curing of the bonding member 59 such as a silver paste used for bonding between the package base 10a and the relay substrate 40 or bonding the gyro vibrating reed 20 on the relay substrate 40, or a gas evaporated from the moisture in the internal space T1 of the package 10 is discharged to the outside in the degassing process.

After sufficiently discharging the outgas such as a noxious gas or a gas evaporated from the moisture, a metal film 45 is formed by sputtering or vapor deposition on the porous body 25b on the outside side (on the bottom surface side of the first-layer substrate 11) of the porous portion 25 and in a region around the porous body 25b, thereby closing for sealing the communication between the internal space T1 and the outside through the porous body 25b.

When the periphery of the porous body 25b on a surface on the outside side of the package 10 (the package base 10a) is previously metalized, the metal film 45 for closing the porous portion 25 can be efficiently formed, and the adhesion between the metal film 45 and the package base 10a is improved, which is preferable.

As the material of the metal film 45 for closing the communication between the internal space T1 and the outside through the porous body 25b of the porous portion 25, a material having a melting point higher than a reflow temperature when the completed vibrating gyro 1 is mounted on an external mounting substrate is desirable. For example, an alloy of gold and tin (Sn), an alloy of gold and germanium (Ge), or the like can be used.

According to the vibrating gyro 1 of the embodiment, outgas is released from the porous portion 25 of the package 10, in which the porous body 25b is buried, and then the porous portion 25 is closed with the metal film 45, whereby the vibrating gyro 1 in which the gyro vibrating reed 20 or the IC chip 30 housed in the internal space T1 of the package 10 is tightly sealed can be formed.

Thus, compared to a related-art package having a structure in which sealing is carried out by closing a through hole (sealing hole) with a sealant, the mechanical strength of the porous portion 25 communicating between the internal space and the outside is highly ensured. Therefore, it is possible to avoid trouble such as the occurrence of a crack in the package base 10a caused by, for example, the pressure of a roller when the lid 19 is seam-welded on the upper end side of the package base 10a.

Unlike the related-art package in which a sealing hole of a through hole is sealed with a spherical metal sealing member, it is unnecessary in the package 10 of the embodiment to form the base substrate (the first-layer substrate 11 in the embodiment) of the package by stacking two flat plate-like base materials for forming a step inside the sealing hole. Therefore, it suffices that the base substrate includes only the first-layer substrate 11 which is one flat plate-like base material.

The package may be configured from a flat plate-like package base, a lid having a concave portion, and the like. Moreover, the package may have a concave portion in the package base and the lid. These configurations can be applied to modified examples described below.

The vibrating gyro (vibrating device) described in the embodiment can be implemented as the following modified examples.

FIRST MODIFIED EXAMPLE

In the embodiment, the first-layer substrate 11 as a base substrate of the package base 10a is formed of one flat plate-like base material. The base substrate is not limited thereto. By using the base substrate formed by stacking two flat plate-like base materials as in the related art, it is possible to provide a package which can realize a highly reliable sealing, and a vibrating gyro (vibrating device) using the same.

Figure 4A:
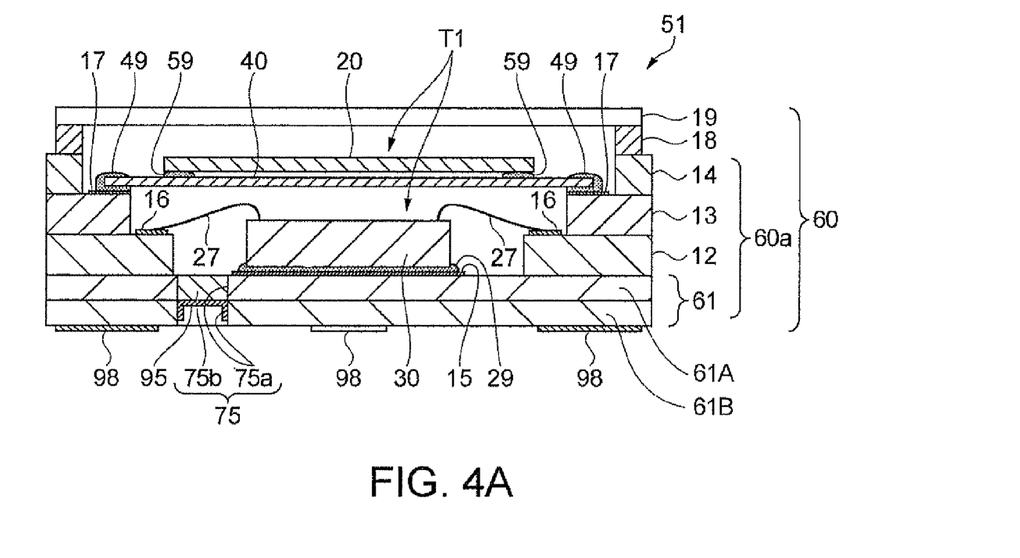
FIG. 4A is a schematic cross-sectional view explaining a vibrating gyro according to a first modified example.
Figure 4B:
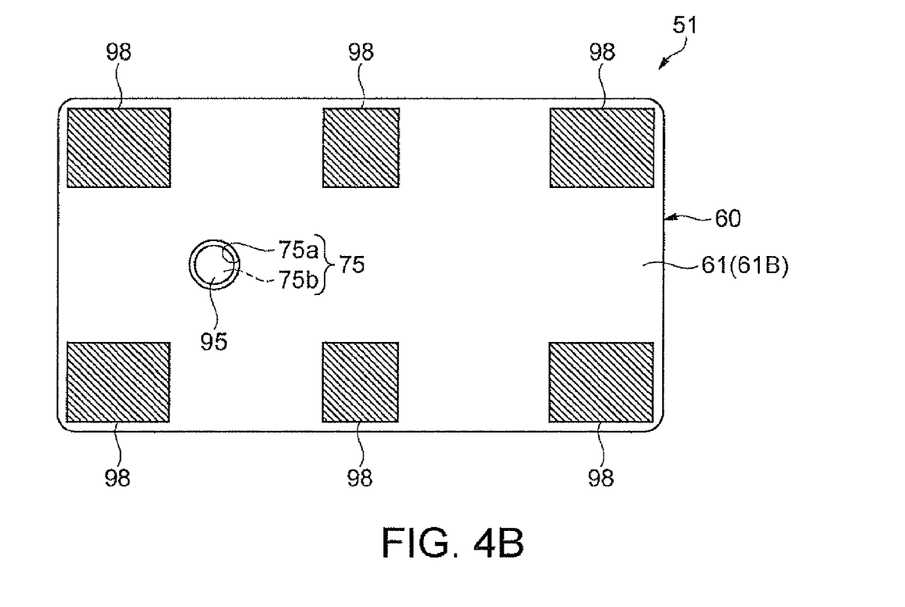
FIG. 4B is a schematic plan view as viewed from the bottom surface side.

FIGS. 4A and 4B explain a package and a vibrating gyro using the same according to a first modified example, in which FIG. 4A is a schematic cross-sectional view; and FIG. 4B is a schematic plan view as viewed from the bottom surface side. In the modified example of the vibrating gyro shown in FIGS. 4A and 4B, the same constituents as those of the vibrating gyro 1 in the embodiment are denoted by the same reference numerals and signs, and the description thereof is omitted.

In FIGS. 4A and 4B, in a vibrating gyro 51 of the modified example, the gyro vibrating reed 20 bonded via the relay substrate 40 and the IC chip 30 bonded by wire bonding in a package base 60a, provided with a concave portion having steps, of a package 60 are tightly sealed.

The package 60 has the same configuration as that of the package 10 of the embodiment except for a first-layer substrate 61 as a base substrate. The first-layer substrate 61 having a different configuration from the package 10 of the embodiment is formed by stacking two flat plate-like base materials 61A and 61B.

In the modified example, the flat plate-like base material 61A is on the internal space T1 side formed by closing the concave portion of the package base 60a with the lid 19, while the flat plate-like base material 61B is on the outside side (on the bottom surface side of the package 60) of the first-layer substrate 61.

For example, concentric communication holes 75a communicating between the internal space T1 and the outside are respectively disposed at positions overlapped each other in plan view in the two flat plate-like base materials 61A and 61B of the first-layer substrate 61. Of the two flat plate-like base materials 61A and 61B of the first-layer substrate 61, a porous body 75b is buried in the flat plate-like base material 61A on the internal space T1 side, whereby a porous portion 75 formed of the communication hole 75a and the porous body 75b is formed. That is, as viewed from the outside of the bottom surface of the package 60, the porous body 75b is visible through the communication hole 75a of the flat plate-like base material 61B on the outside side.

The package 60 having the porous portion 75 according to the modified example can be sealed by the same method as that of the embodiment using the package 10. That is, the lid 19 is bonded via the seal ring 18 above the package base 60a having the IC chip 30 and the gyro vibrating reed 20 bonded in the concave portion, the package 60 is placed in a vacuum chamber, the pressure is reduced to a predetermined degree of vacuum, and the outgas in the internal space T1 is discharged from the porous body 75b of the porous portion 75 to the outside.

After sufficiently discharging the outgas, a metal film 95 is formed by sputtering or vapor deposition on the outside side of the porous body 75b of the porous portion 75, thereby closing the communication between the internal space T1 and the outside through the porous body 75b to seal the package 60.

In this case, the metal film 95 formed in the porous portion 75 is formed in the communication hole 75a of the flat plate-like base material 61B on the outside side, of the two flat plate-like base materials 61A and 61B constituting the first-layer substrate 61, so as to cover a surface on the outside side of the porous body 75b buried in the communication hole 75a of the flat plate-like base material 61A on the internal space T1 side.

FIGS. 4A and 4B illustrate a configuration in which the concentric communication holes 75a having the same shape in plan view are respectively disposed in the two flat plate-like base materials 61A and 61B. However, the communication holes 75a disposed in the flat plate-like base materials 61A and 61B may be different in shape in plan view as long as they are disposed at positions overlapped each other in plan view.

In this case, for covering the porous body 75b with the metal film 95 to form an airtight state, it is preferable to form the communication hole 75a of the flat plate-like base material 61B on the outside side larger than the communication hole 75a of the flat plate-like base material 61A on the internal space T1 side in which the porous body 75b is buried. By forming the communication hole 75a of the flat plate-like base material 61B on the outside side larger as described above, the related-art sealing using a spherical metal sealing member is also available.

According to the configuration of the vibrating gyro 51 of the first modified example, the metal film 95 closing the porous portion 75 is formed in the communication hole 75a of the flat plate-like base material 61B on the outside side, of the first-layer substrate (base substrate) 61 formed of the two flat plate-like base materials 61A and 61B, and on the surface on the outside side of the porous body 75b buried in the communication hole 75a of the flat plate-like base material 61A on the internal space T1 side.

With this configuration, it is possible to avoid trouble such as the occurrence of a flaw in the metal film 95 caused by the contact of the bottom surface of the package 60 with an external portion, or a sealing failure caused by peeling of the metal film 95, as in the case where the metal film 95 is formed on the surface on the outside side of the flat plate-like base material 61B on the outside side, that is, on the bottom surface of the package 60.

SECOND MODIFIED EXAMPLE

In the embodiment and the first modified example, the porous portions 25 and 75 are formed on the surfaces on the outside sides of the first-layer substrates 11 and 61 as base substrates of the packages 10 and 60, that is, on the outer bottom surface sides of the packages 10 and 60. However, the configuration is not limited thereto. The porous portion may be disposed on a side surface (side wall) of the package.

Figure 5A:
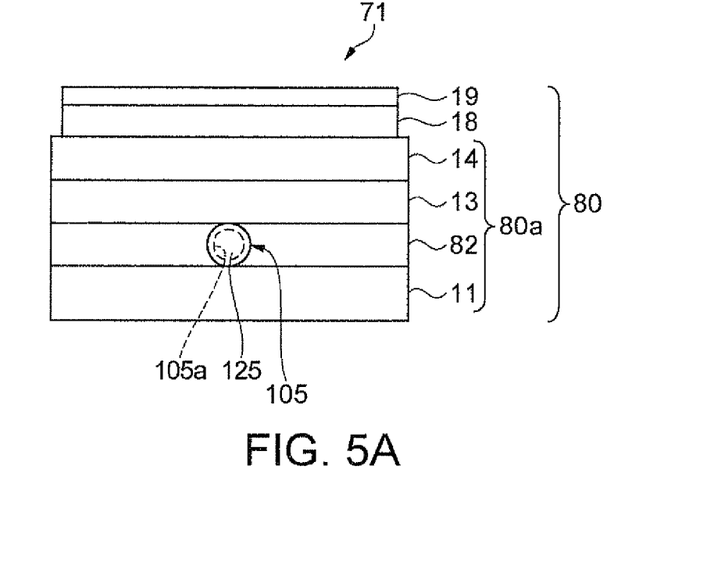
FIG. 5A is a schematic side view explaining a vibrating gyro according to a second modified example.
Figure 5B:
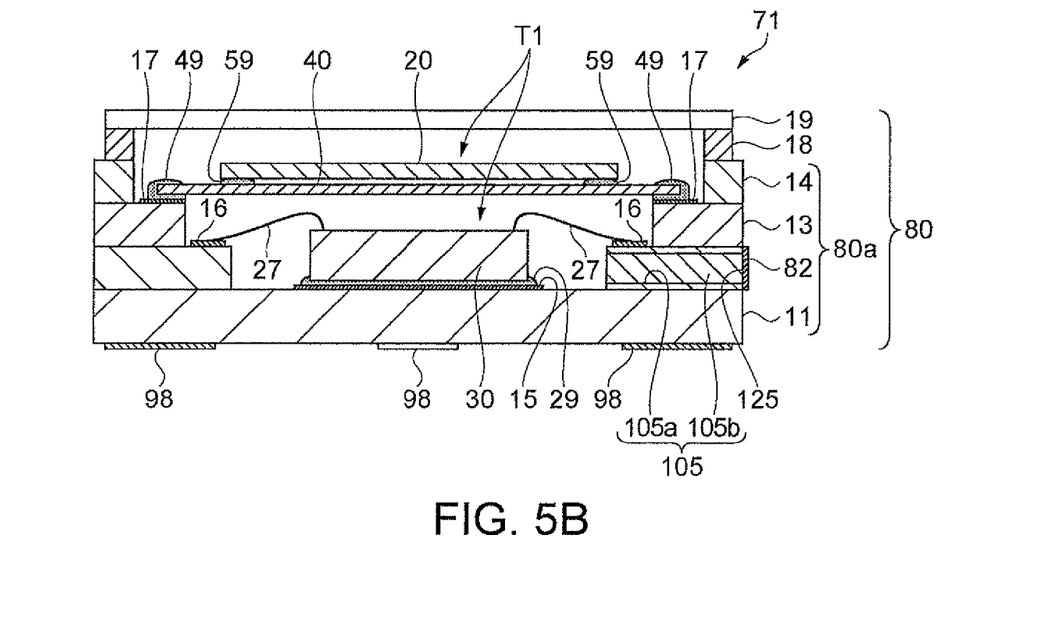
FIG. 5B is a schematic cross-sectional view.

FIGS. 5A and 5B explain a vibrating gyro having a porous portion on a side wall of a package according to a second modified example, in which FIG. 5A is a side view; and FIG. 5B is a schematic cross-sectional view. In the second modified example of the vibrating gyro shown in FIGS. 5A and 5B, the same constituents as those of the vibrating gyro 1 of the embodiment are denoted by the same reference numerals and signs, and the description thereof is omitted.

In FIGS. 5A and 5B, in a vibrating gyro 71 of the modified example, the gyro vibrating reed 20 bonded via the relay substrate 40 and the IC chip 30 bonded by wire bonding in a package base 80a, provided with a concave portion having steps, of a package 80 are tightly sealed.

The package 80 has the same configuration as that of the package 10 of the embodiment except for a second-layer substrate 82 as one of the frame-like substrates stacked on the first-layer substrate 11 as a base substrate.

The frame-like second-layer substrate 82 stacked on the first-layer substrate 11 forms parts of side walls of the package base 80a having the concave portion. A porous portion 105 formed of a communication hole 105a communicating between the internal space T1 of the package 80 and the outside and a porous body 105b buried in the communication hole 105a is formed in one of the side walls of the package base 80a formed of the second-layer substrate 82. The side walls of the package 80 (the package base 80a) are in contact with the internal space T1.

The package 80 having the porous portion 105 according to the modified example can be sealed by the same method as that of the embodiment and the first modified example using the packages 10 and 60.

That is, the lid 19 is bonded via the seal ring 18 above the package base 80a having the IC chip 30 and the gyro vibrating reed 20 bonded in the concave portion, the package 80 is placed in a vacuum chamber, the pressure is reduced to a predetermined degree of vacuum, and the outgas in the internal space T1 is discharged from the porous body 105b of the porous portion 105 to the outside. After sufficiently discharging the outgas, a metal film 125 is formed by sputtering or vapor deposition on the outside side of the porous body 105b of the porous portion 105, thereby closing the communication between the internal space T1 and the outside through the porous body 105b to seal the package 80.

In the modified example shown in FIGS. 5A and 5B, an example has been described in which the porous portion 105 is disposed in the second-layer substrate 82, stacked directly on the first-layer substrate 11 as a base substrate, of the frame-like substrates forming the side walls of the package 80. However, the configuration is not limited thereto. The porous portion may be disposed in the third-layer substrate 13 or the fourth-layer substrate 14 as another frame-like substrate forming the side walls of the package 80. Alternatively, the porous portion may be disposed in a range spanning the frame-like substrates.

According to the configuration of the vibrating gyro 71 of the second modified example, the porous portion 105 is disposed not in the first-layer substrate 11 serving as, for example, a mounting surface relative to an external mounting substrate but in the side wall of the package 80. Therefore, it is possible to avoid trouble such as the occurrence of a flaw caused by the contact of the metal film 125 closing the communication between the outside side and the internal space T1 side through the porous body 105b of the porous portion 105 with an external mounting substrate or the like, or a sealing failure caused by peeling of the metal film 125.

Moreover, compared to the case of disposing the porous portion in the outer bottom surface of the package, the area of the vibrating gyro 71 as viewed in plan can be reduced.

The embodiment of the invention made by the inventor has been specifically described. However, the invention is not limited to the embodiment and the modified examples, but various modifications can be added within a range not departing from the gist thereof.

In the embodiment for example, a configuration using, as a metal material for forming electrodes, wirings, or terminals, a material including chromium and gold stacked in this order has been described.

However, the configuration is not limited thereto. It is possible to use a material obtained by stacking nickel and chromium in this order as an under layer and depositing an electrode layer made of, for example, gold on the under layer by vapor deposition or sputtering, or to use a metal material such as titanium, tantalum, tungsten, or aluminum. Moreover, it is also possible to use magnesium or the like.

The specific mode described in the embodiment and the modified examples, for example, the shape of the gyro vibrating reed 20 or the like is not limited to the shape described above.

Similarly, the positions or shapes of electrodes, wirings, terminals, or the like are not limited to those of the embodiment.

Moreover in the embodiment and the modified examples, the vibrating gyros 1, 51, and 71 as vibrating devices have been described. However, the invention is not limited thereto. The invention is directed to a vibrating device having a configuration in which a vibrating reed housed in an internal space of a package is tightly sealed, for example, a sensor or the like using a vibrating device other than an oscillator or a vibrating gyro.

Electronic Apparatus

The vibrating device such as the vibrating gyro or an oscillator can be preferably used as a sensing device or a timing device for electronic apparatuses such as digital still cameras, video cameras, navigation systems, pointing devices, game controllers, mobile phones, electronic books, personal computers, television sets, video recorders, pagers, electronic notebooks, calculators, word processors, workstations, videophones, POS terminals, devices including touch panels. In either case, it is possible to provide an electronic apparatus which exhibits the effects described in the embodiment and the modified examples.

What is claimed is:

1. A vibrating device comprising:
a package having an internal space; and
a vibrating reed housed in the internal space of the package, wherein
the package has a porous portion formed of a communication hole communicating between the internal space and the outside and a porous body buried in the communication hole, and
a metal film closing the internal space is arranged on the outside side of the porous portion.

2. The vibrating device according to claim 1, wherein
the package has a base substrate formed by stacking two flat plate-like base materials, the porous portion is formed in the flat plate-like base material on the internal space side of the two flat plate-like base materials, and a communication hole through which the porous portion is visible from the outside is formed in the flat plate-like base material on the outside side of the two flat plate-like base materials.

3. The vibrating device according to claim 1, wherein
the porous portion is disposed on a side wall of the package.

4. The vibrating device according to claim 1, wherein
the metal film is formed by sputtering or vapor deposition.

5. The vibrating device according to claim 1, wherein
a periphery of the porous portion on a surface on the outside side of the package is metallized.

6. A package capable of housing a vibrating reed in an internal space thereof, comprising:
a porous portion formed of a communication hole communicating between the internal space and the outside, and a porous body buried in the communication hole, the porous portion having a porous body with a plurality of air holes adapted to allow communication between the internal space and the outside.

7. The package according to claim 6, further comprising a base substrate formed by stacking two flat plate-like base materials, wherein
the porous portion is formed in the flat plate-like base material on the internal space side of the two flat plate-like base materials, and a communication hole through which the porous portion is visible from the outside is formed in the flat plate-like base material on the outside side of the two flat plate-like base materials.

8. The package according to claim 6, wherein
the porous portion is disposed on a side wall.

9. The package according to claim 6, wherein
a periphery of the porous portion on a surface on the outside side is metallized.

10. An electronic apparatus comprising the vibrating device according to claim 1.

* * * * *